(12) United States Patent
Toda

(10) Patent No.: US 12,176,474 B2
(45) Date of Patent: Dec. 24, 2024

(54) MICRO PATTERNS CREATED ON THE SURFACE TO CONTROL PLACEMENT AND UNIFORMITY OF MATERIAL WITH VISCOSITY

(71) Applicant: Intel Corporation, Santa Clara, CA (US)

(72) Inventor: Asako Toda, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 17/125,505

(22) Filed: Dec. 17, 2020

(65) Prior Publication Data
US 2022/0199881 A1 Jun. 23, 2022

(51) Int. Cl.
*H01L 33/64* (2010.01)
*G02B 6/42* (2006.01)
*H01L 25/075* (2006.01)
*H01L 33/58* (2010.01)

(52) U.S. Cl.
CPC .......... *H01L 33/642* (2013.01); *G02B 6/4251* (2013.01); *G02B 6/4269* (2013.01); *H01L 25/075* (2013.01); *H01L 33/58* (2013.01)

(58) Field of Classification Search
CPC ..... H01L 33/642; H01L 25/075; H01L 33/58; G02B 6/4251; G02B 6/4269; G02B 6/4272; G02B 6/4244; G02B 6/424; G02B 6/4245; G02B 6/4268

USPC .......................................................... 257/98
See application file for complete search history.

(56) References Cited

U.S. PATENT DOCUMENTS

| | | | |
|---|---|---|---|
| 2010/0215317 A1* | 8/2010 | Rolston | G02B 6/4292 385/53 |
| 2017/0110384 A1* | 4/2017 | Zhao | H01L 24/32 |
| 2019/0271810 A1* | 9/2019 | Ring | C23C 16/308 |

FOREIGN PATENT DOCUMENTS

| | | |
|---|---|---|
| EP | 2507830 | 10/2012 |
| WO | WO 2011068777 | 6/2011 |

OTHER PUBLICATIONS

Extended European Search Report for European Patent No. 21195649.5 mailed Feb. 25, 2022, 7 pgs.

* cited by examiner

*Primary Examiner* — Karen Kusumakar
*Assistant Examiner* — Shawn Shaw Muslim
(74) *Attorney, Agent, or Firm* — Schwabe, Williamson & Wyatt, P.C.

(57) ABSTRACT

Embodiments disclosed herein include optical packages. In an embodiment, an optical package comprises a package substrate and a compute die on the package substrate. In an embodiment, an optics die is on the package substrate, and an integrated heat spreader (IHS) is over the compute die and the optics die. In an embodiment, channels are disposed on a surface of the IHS facing the package substrate.

19 Claims, 18 Drawing Sheets

MICRO PATTERNS CREATED ON THE SURFACE TO CONTROL PLACEMENT AND UNIFORMITY OF MATERIAL WITH VISCOSITY

GOVERNMENT LICENSE RIGHTS

This invention was made with Government support under Agreement No. HR0011-19-3-0003, awarded by DARPA. The Government has certain rights in the invention.

TECHNICAL FIELD

Embodiments of the present disclosure relate to optical packaging systems, and more particularly to multi chip optical packages.

BACKGROUND

Bandwidth increases in computing platforms has resulted in a switch from electrical signals to optical signals. In an optical platform, a compute die is communicatively coupled to a plurality of optics dies. The optics dies are configured to convert signals between electrical and optical regimes. In some instances optical connectors are attached to the optics dies. The optical connectors house optical fibers over which the optical signals are propagated. The ends of the optical fibers are exposed and fit into V-grooves on the optics die.

The use of optical connectors is not without issue. One issue is that optical connectors result in incomplete encapsulation of the system. This may provide reliability concerns. For example, incomplete encapsulation will allow moisture to enter the package, and ice can form when temperatures go below 0° C. When the ice melts, short circuits may occur. Another issue is that existing optical connectors may not be compatible with high volume manufacturing (HVM). Exposed optical fibers are vulnerable to mechanical shock during handling and thermal shock during solder reflow. Additionally, the tool for mounting the optical connector may require several pick-up tool tips in order to provide the mounting.

Yet another drawback of existing optical systems is the uncontrolled flow of underfill and encapsulation materials. For example, the multi-chip packages require controlled underfills. Additionally, encapsulation materials also need precise control in order not to spread beyond desired areas. Currently, location and uniformity of material with a certain viscosity is hard to control by just dispensing it on planar surfaces.

Yet another drawback of existing optical systems is the need for a large external fiber shuffler for routing the optical fibers. The large footprint of fiber shufflers occupy a large area on the package substrate and/or the board. As such, valuable real estate is lost to optical routing.

EMBODIMENTS OF THE PRESENT DISCLOSURE

Figure 1A:
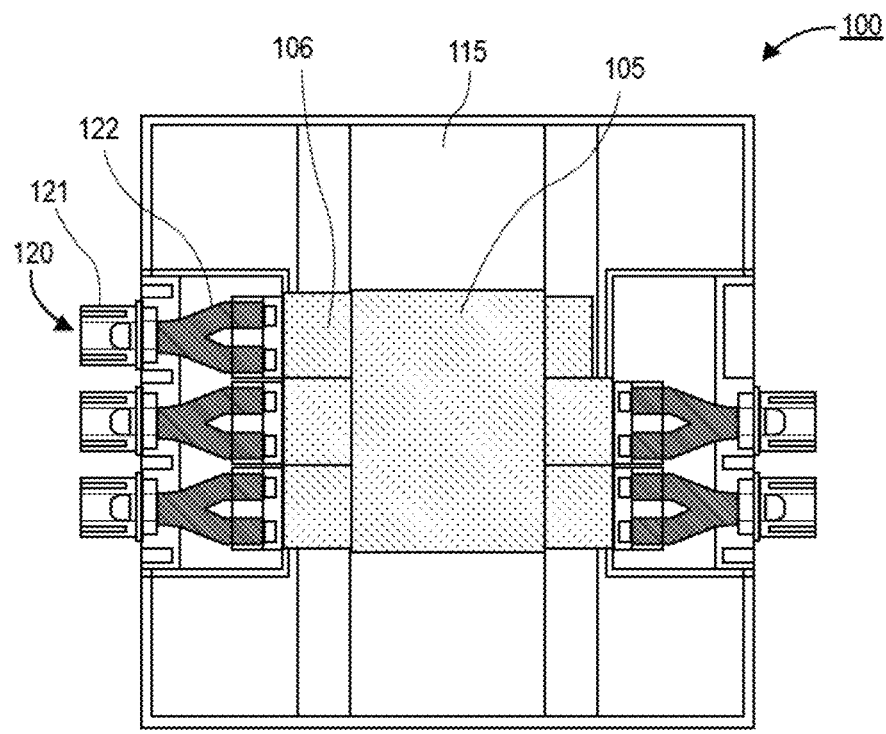
FIG. 1A is a plan view illustration of an optical package from below with the package substrate being transparent in order to see the dies and the optical connectors, in accordance with an embodiment.

Described herein are multi chip optical packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, multi-chip optical packages suffer from various integration issues. Accordingly, embodiments disclosed herein include various architectures for improving the reliability and ease of assembly, as well as providing a decreased footprint. For example, reliability may be improved by sealing the optical connectors. Ease of assembly may be improved by providing micro channels and/or by embedding the optical fibers. The footprint may be decreased by providing a shuffler with a reduced footprint.

Particularly, in some embodiments, the optical connectors are fully encapsulated. The full encapsulation may prevent reliability concerns, such as water in the package resulting in short circuits. The full encapsulation is made by providing a lid over the optical interconnects. The lid may cover a recessed portion of the package substrate. The lid may be clipped or adhered to the integrated heat spreader (IHS) with an adhesive or by magnets. The lid may be further improved by providing a sealant. The sealant fills the cavity and surrounds the ferrules to provide a complete seal at the edge of the optical package.

In some embodiments, ease of assembly is increased by providing micro channels in various surfaces. The micro channels can be used to direct and/or restrict flow of dispensed materials, such as epoxies, underfills, and sealants. For example, the micro channels may be provided on package substrates, the IHS, or the V-grooves on the optics die. Various micro channel designs can be used to promote the flow of the dispensed fluid in a certain direction and/or restrict flow of the dispensed fluid.

In some embodiments, ease of assembly and reliability is further improved by providing the fibers in a molded housing. Particularly, the ferrule, a fiber distribution housing, and a fiber holder are molded into a single component. Molding into a single component allows for a single tip in a pick-and-place tool to be used to insert the fibers into the V-grooves on the optics die. Additionally, the molding protects the fibers from thermal and mechanical shock.

In some embodiments, the footprint of the optical system is reduced by utilizing an improved fiber shuffler. In a fiber shuffler design, the optical fibers are coupled to grating couplers on the optics die. The optical fibers are bent by a fiber array unit (FAU) and fed into a fiber shuffler that has V-grooves with different depths. After exiting the fiber shuffler, a ferrule aligns the fibers into a plurality of columns. As such, a single row at a first end of optical fibers can be rerouted to form a plurality of columns at a second end of the optical fibers.

Referring now to FIG. 1A, a plan view illustration of an optical package 100 is shown, in accordance with an embodiment. In an embodiment, the optical package 100 is shown from below with the package substrate being transparent for clarity. As shown, the optical package 100 comprises a compute die 105 and a plurality of optics dies 106. The compute die 105 may be any die, such as a processor, a graphics processor, or the like. In an embodiment, the optics dies 106 provide functionality for converting between optical and electrical signals. The optics dies 106 may be communicatively coupled to the compute die 105 by a bridge or other interconnect on the package substrate (not shown).

In an embodiment, optical connectors 120 may be coupled to the optics dies 106. The optical connectors 120 may comprise a plurality of fibers 122 and a ferrule 121. For example, the plurality of fibers 122 may comprise twenty four fibers in some embodiments. The fibers 122 may be secured into V-grooves on the optics dies 106.

As shown in FIG. 1A, an integrated heat spreader (IHS) 115 is provided over top surfaces of the compute die 105 and the optics dies 106. That is, in the view of FIG. 1A, the IHS 115 is below the compute die 105 and the optics die 106. In an embodiment, the IHS 115 also covers portions of the optical connectors 120. In an embodiment, the ferrules 121 may extend out past an edge of the IHS 115.

Figure 1B:
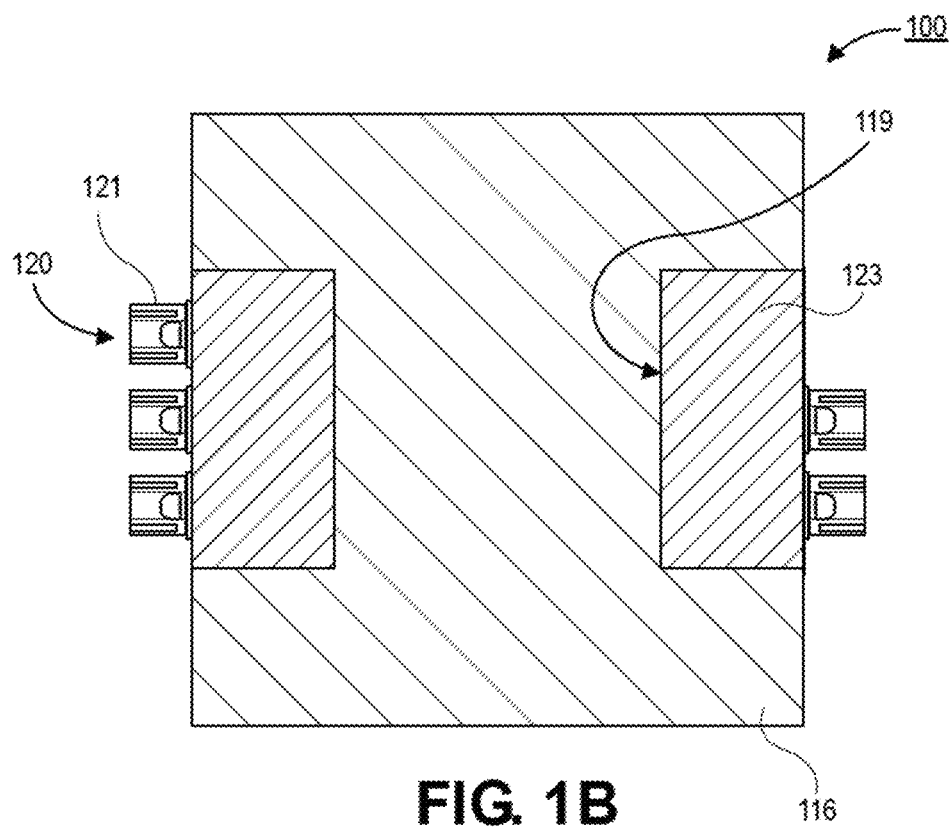
FIG. 1B is a plan view illustration of an optical package from below that shows lids over recesses in the package substrate, in accordance with an embodiment.

Referring now to FIG. 1B, a plan view illustration of the bottom of the optical package 100 showing the package substrate 116 is shown, in accordance with an embodiment. In an embodiment, the package substrate 116 may have an H-shaped footprint. That is, recesses 119 may be provided along opposite edges of the package substrate 116. In an embodiment, the optical connectors 120 are provided in the recesses 119. As shown in FIG. 1B, the recesses 119 are covered by a lid 123. The lid 123 provides a seal around the bottom of the optical connectors 120.

The lid 123 may comprise any number of architectures. For example, the lid 123 may be a clip on component. In other embodiments, the lid 123 may be secured to the IHS 116 by an adhesive or by magnets.

Figure 2A:
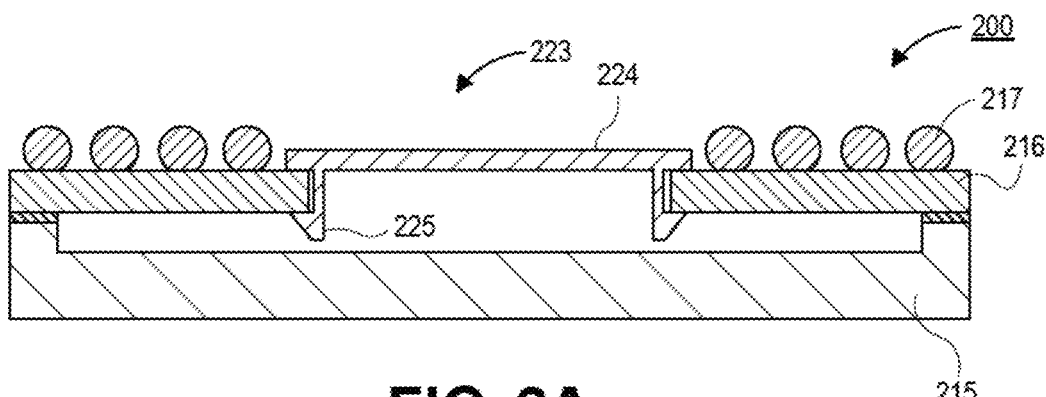
FIG. 2A is a cross-sectional illustration of an optical package that shows a lid with clips, in accordance with an embodiment.
Figure 2B:
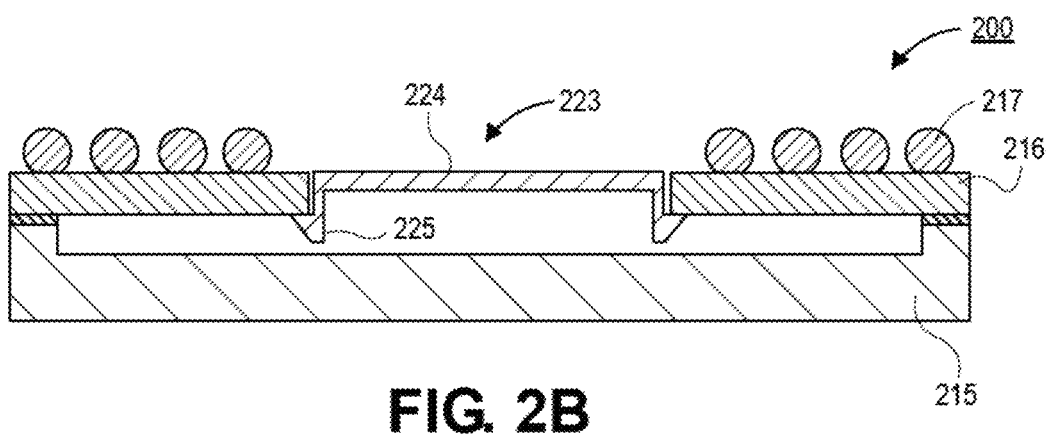
FIG. 2B is a cross-sectional illustration of an optical package that shows a lid with clips that is substantially coplanar with the package substrate, in accordance with an embodiment.
Figure 2C:
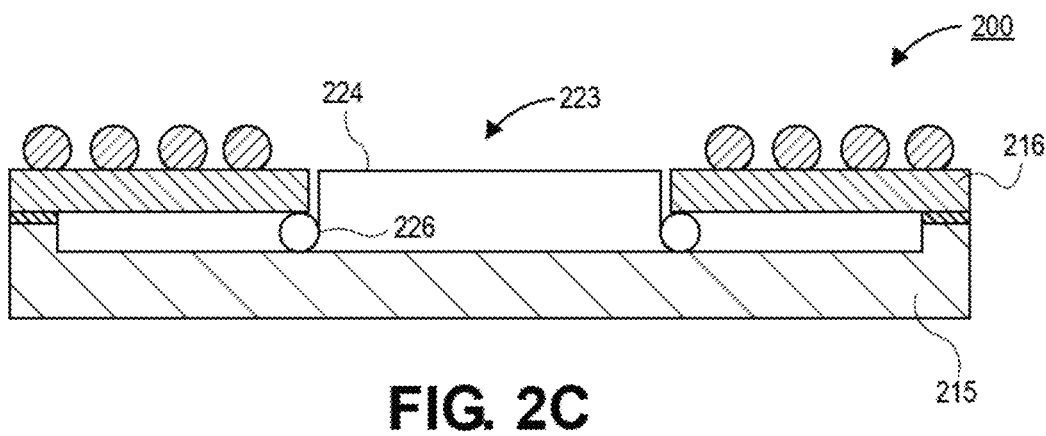
FIG. 2C is a cross-sectional illustration of an optical package that shows a lid with spring clips, in accordance with an embodiment.

Examples of various lid 123 architectures that include clip on architectures are shown in FIGS. 2A-2C. As shown in FIG. 2A, the optical package 200 comprises a package substrate 216 and an IHS 215. Solder balls 217 or other interconnects may be provided on the package substrate 216. In an embodiment, the lid 223 comprises a plate 224 and clips 225. The plate 224 seals an opening (i.e., the recess) in the package substrate 216. The clips 225 may secure the plate 224 to the package substrate 216. In an embodiment, the plate 224 and the clips 225 may comprise a plastic material or they may comprise metallic materials. In the illustrated embodiment, the plate 224 sits above a surface of the package substrate 216.

Referring now to FIG. 2B, a cross-sectional illustration of the optical package 200 with an alternative lid 223 architecture is shown, in accordance with an embodiment. As shown, the plate 224 may be substantially coplanar with a surface of the package substrate 216.

Referring now to FIG. 2C, a cross-sectional illustration of the optical package with yet another lid 223 architecture is shown, in accordance with an embodiment. In an embodiment, the lid 223 may comprise spring ends 226 on opposite ends of the plate 224. The spring ends 226 may bend inward to pass through the opening and expand out after passing the opening to secure the lid 223. In an embodiment, the plate 224 and the spring end 226 may comprise a thin metal sheet, though other materials may also be used in accordance with additional embodiments.

Figure 3:
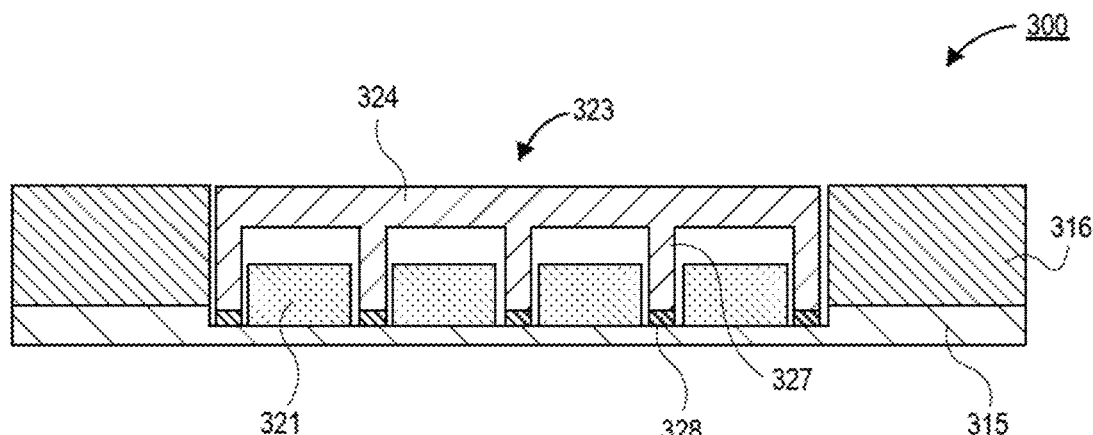
FIG. 3 is a cross-sectional illustration of an optical package with a lid that is adhered to an integrated heat spreader (IHS) with an adhesive, in accordance with an embodiment.

Referring now to FIG. 3, a cross-sectional illustrations of an optical package 300 is shown, in accordance with an additional embodiment. In an embodiment, the optical package 300 comprises a package substrate 316 and an IHS 315. Ferrules 321 are provided on the IHS 315. In an embodiment, a lid 323 provides a seal around the ferrules 321. The lid 323 may comprise a plate 324 with support posts 327. The support posts 327 may extend down to the IHS 315 between the ferrules 321. In an embodiment, the support posts 327 are secured to the IHS 315 by an adhesive 328.

Figure 4A:
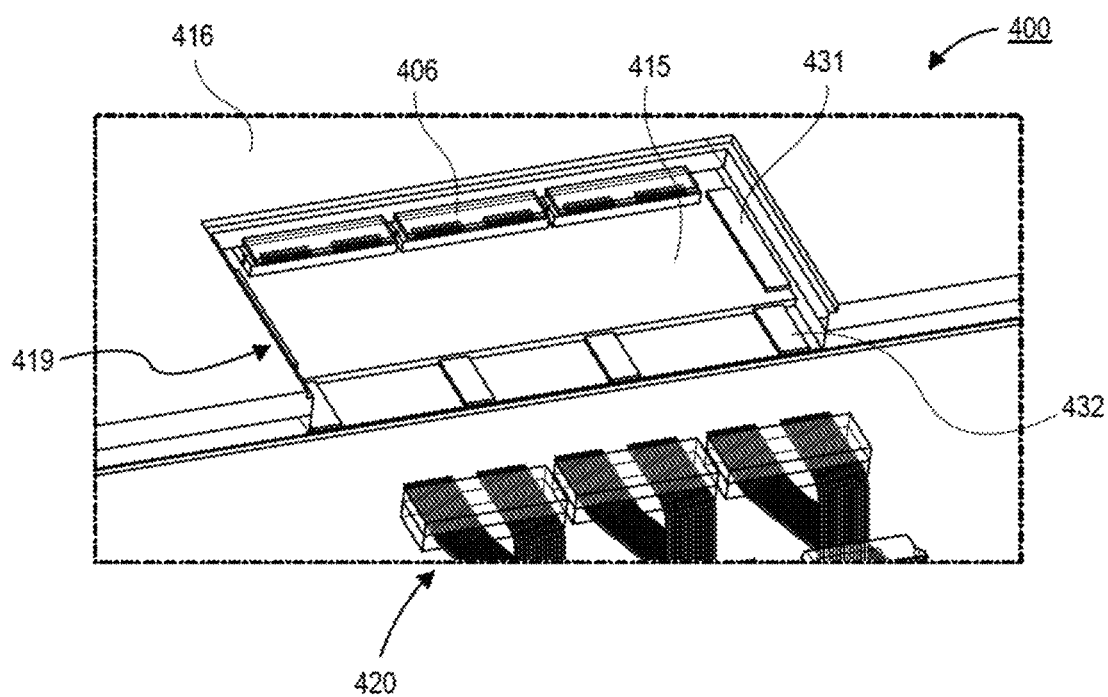
FIG. 4A is a perspective view illustration of a recess in the package substrate and magnets provided on the IHS, in accordance with an embodiment.

Referring now to FIG. 4A, a perspective view illustration of an optical package 400 is shown, in accordance with an embodiment. In an embodiment, the optical package 400 comprises a package substrate 416 with a recess 419. The IHS 415 is shown below the recess 419. Edges of the optics dies 406 are also illustrated in FIG. 4A. The optical connectors 420 are shown removed from the recess 419 in order to more clearly illustrate the layout on the IHS 415. As shown, a plurality of magnets 431 and 432 may be provided on the IHS 415. The magnets 431 and 432 may be positioned to interface with support posts of the lid (not shown in FIG. 4A). While magnets 431 and 432 are shown in FIG. 4A, it is to be appreciated that the magnets may alternatively be formed only on the lid in cases where the IHS 415 is a magnetic or metallic material.

Figure 4B:
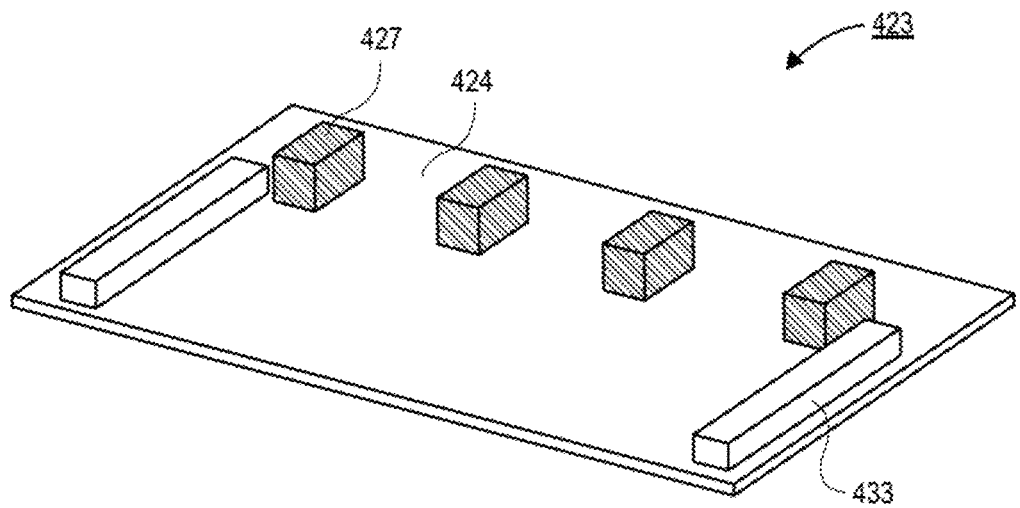
FIG. 4B is a perspective view illustration of a lid that can be attached to the IHS using magnets, in accordance with an embodiment.

Referring now to FIG. 4B, a perspective view illustration of the lid 423 is shown, in accordance with an embodiment. As shown, the lid 423 comprises a plate 424 and support posts 427. Magnets 433 may also be provided along edges of the plate 424. The magnets 433 may align with the positioning of magnets 431 shown in FIG. 4A. Additionally, magnets may also be included on the support posts 427 in some embodiments.

It is to be appreciated that the lids described above provide a seal of the bottom surface of the recess in the package substrate. However, the edge surface between the lid and the IHS where the ferrules exit the cavity may not be sealed in some embodiments. In additional embodiments, a sealant may also be included in order to provide a seal around the ferrules. Examples of such embodiments are provided in FIGS. 5A-7B.

Figure 5A:
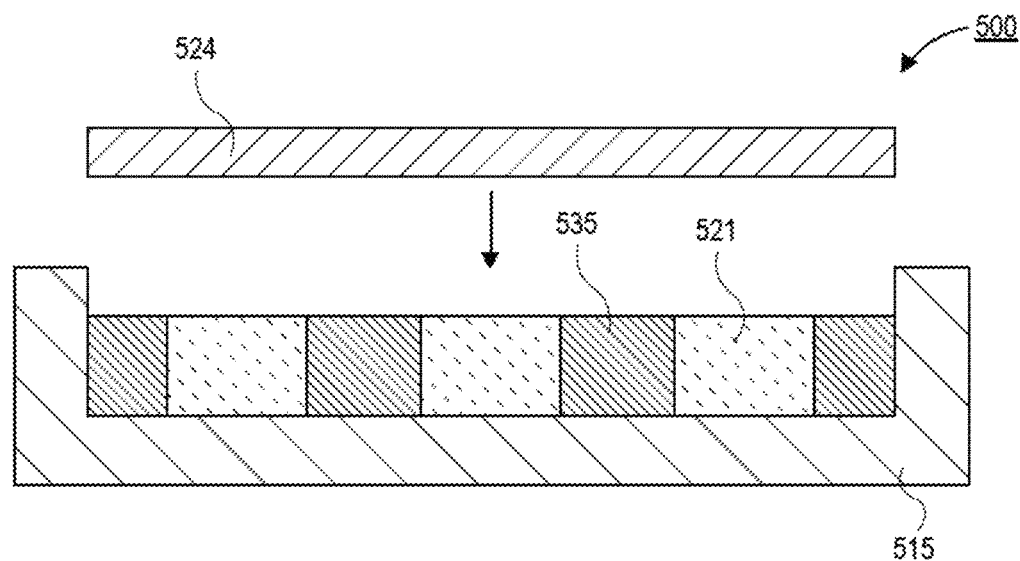
FIGS. 5A and 5B illustrate a process for fully encapsulating the recess with a sealant, in accordance with an embodiment.
Figure 5B:
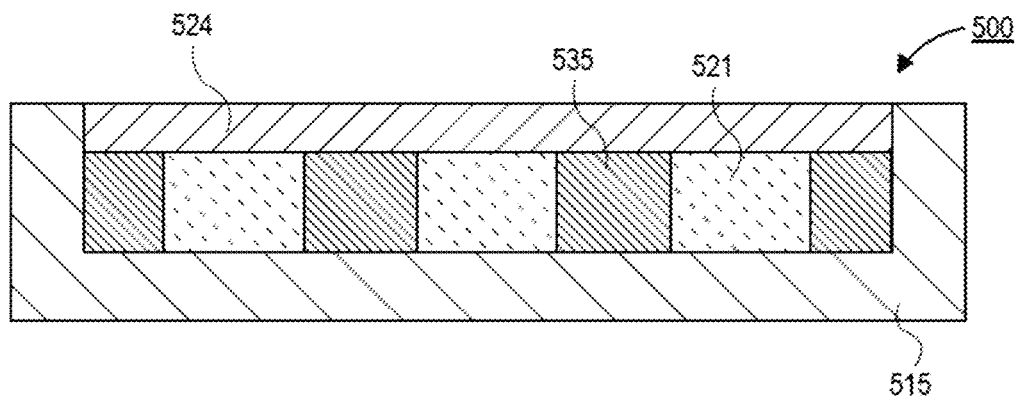

Referring now to FIG. 5A, an edge view of the recess in an optical package 500 is shown, in accordance with an embodiment. As shown, the ferrules 521 are set on the IHS 515. A sealant 535 may be disposed around the ferrules 521. The sealant 535 may be a high viscosity sealant. For example, the sealant 535 may be an epoxy or the like. In an embodiment, a plate 524 of a lid is brought down into contact with the sealant 535, as indicated by the arrow. In an embodiment, the plate 524 may be part of any of the lids such as those described above. For example, the plate 524 may be clipped or otherwise adhered to the IHS (e.g., with adhesive or magnets). As shown in FIG. 5B, the edge of the optical package 500 is completely sealed with the plate 524, the sealant 535, and the ferrules 521 completely filling the edge of the recess. In addition to providing a seal for the recess, the sealant 535 may also prevent the ferrules from moving when mechanical and/or thermal shock is applied to the optical package 500.

Figure 6A:
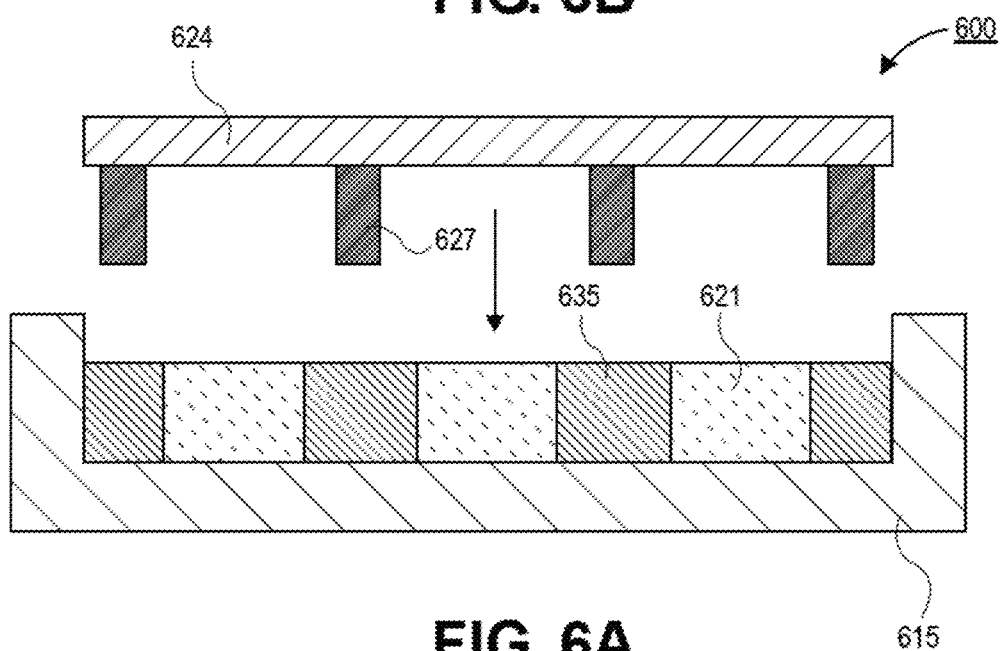
FIGS. 6A and 6B illustrate a process for fully encapsulating the recess with a sealant using a lid with protrusions, in accordance with an embodiment.

Referring now to FIG. 6A, an edge view of the recess in an optical package 600 is shown, in accordance with an embodiment. In an embodiment, the plate 624 may further comprise supports 627. In an embodiment, the supports 627 may be attached to the plate 624, or the supports 627 may be a monolithic part of the plate 624. The supports 627 are configured to be placed between the ferrules 621 on the IHS 615. The supports 627 provide additional volume that may make it easier for the sealant 635 to provide a proper seal of the recess.

Figure 6B:
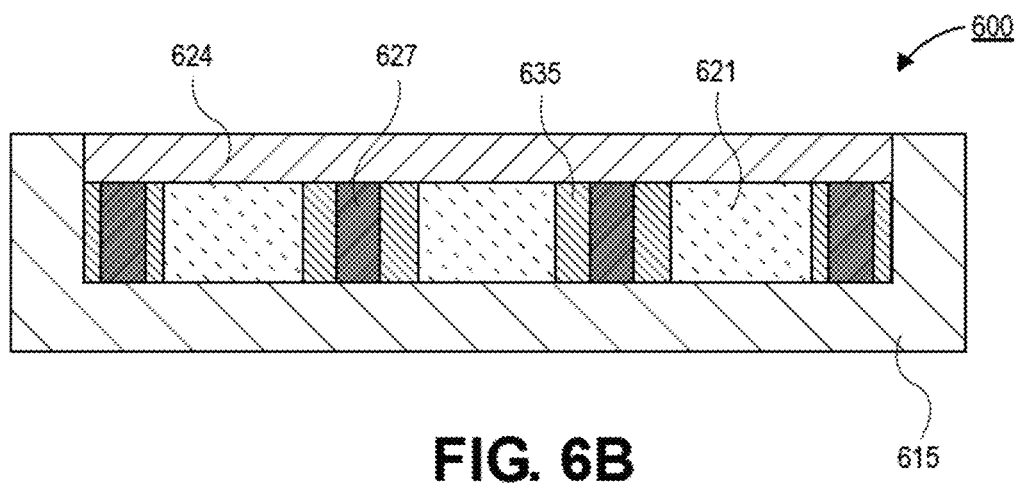

As shown by the arrow in FIG. 6A, the plate 624 and supports 627 are inserted down towards the IHS 615 to provide a device similar to the optical package 600 shown in FIG. 6B. In FIG. 6B, the spacings between the ferrules 621 are filled by a combination of the supports 627 and the sealant 635. As such, a smaller volume of sealant 635 is necessary to fill the edge of the recess.

Figure 7A:
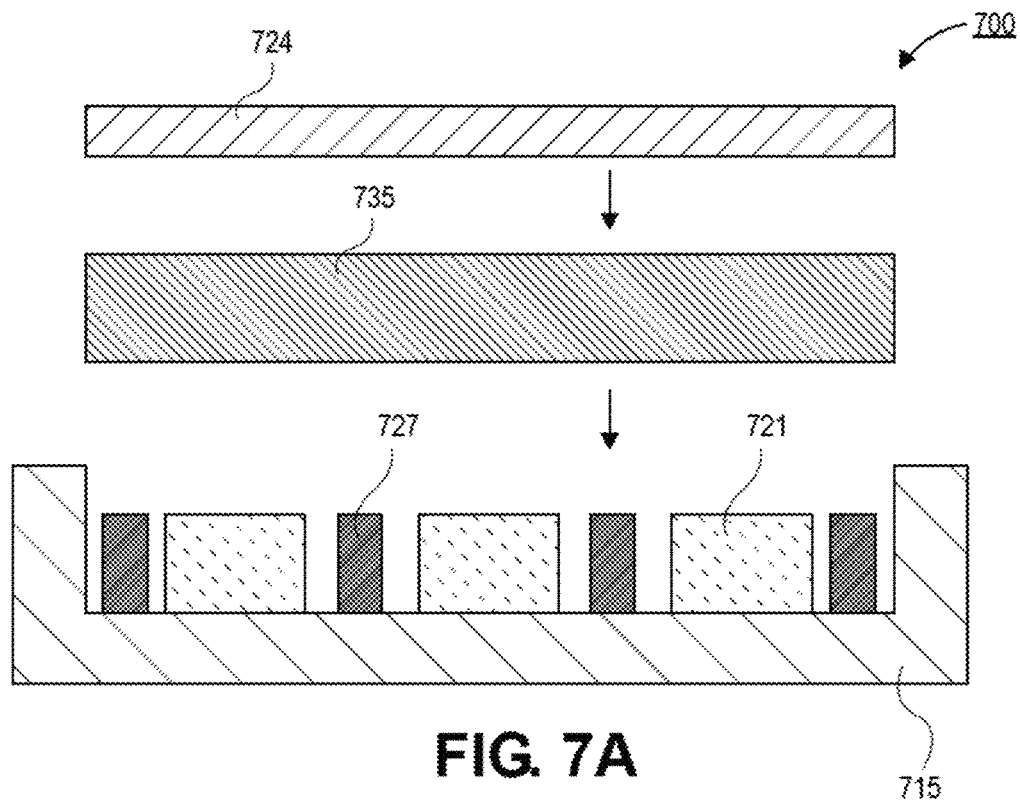
FIGS. 7A and 7B illustrate a process for fully encapsulating the recess with a sealant using a lid that interfaces with protrusions on the IHS, in accordance with an embodiment.
Figure 7B:
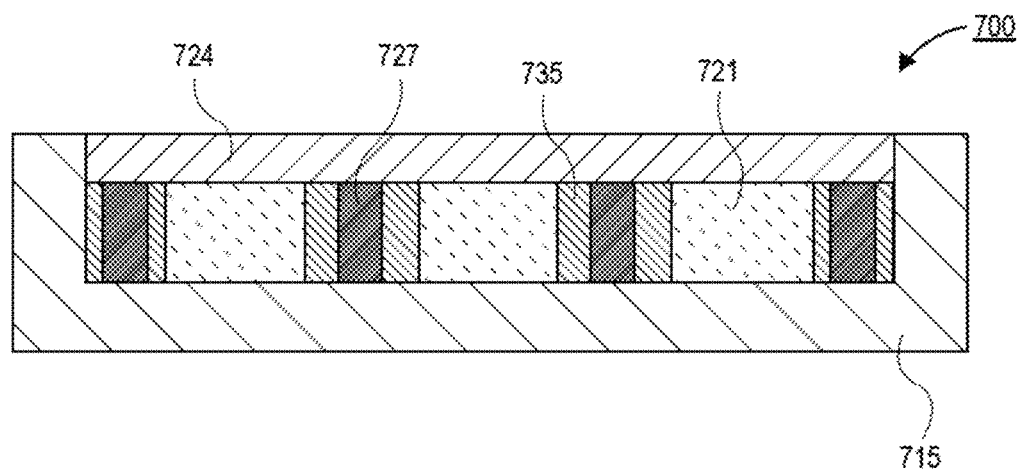

Referring now to FIGS. 7A and 7B, a series of edge view illustrations depicting a process for sealing a recess in an optical package 700 is shown, in accordance with an additional embodiment. As shown in FIG. 7A, a plurality of supports 727 are provided between the ferrules 721 over the IHS 715. That is, instead of connecting the supports 727 to the plate 724 (as shown in FIGS. 6A and 6B), the supports 727 are attached to the IHS 715. In an embodiment, the supports 727 may be adhered to the IHS 715, or the supports 727 may be a monolithic part of the IHS 715. As indicated by the arrows, the sealant 735 and the plate 724 are then added to provide a structure similar to that shown in FIG. 7B. Similar to FIG. 6B, the spacings between the ferrules 721 are filled by a combination of the supports 727 and the sealant 735. As such, a smaller volume of sealant 735 is necessary to fill the edge of the recess.

The use of a lid and a sealant such as described above allows for the recess into the package substrate to be fully sealed. The IHS may form one surface of a cavity and the package substrate provides portions of the sidewalls of the cavity. In an embodiment, the lid can provide the surface of the cavity opposite from the IHS, and the sealant can provide the missing sidewall of the cavity. As such, the cavity can be fully sealed to prevent moisture from entering the optical package. In some embodiments, the sealant may also substantially fill the cavity.

Figure 8A:
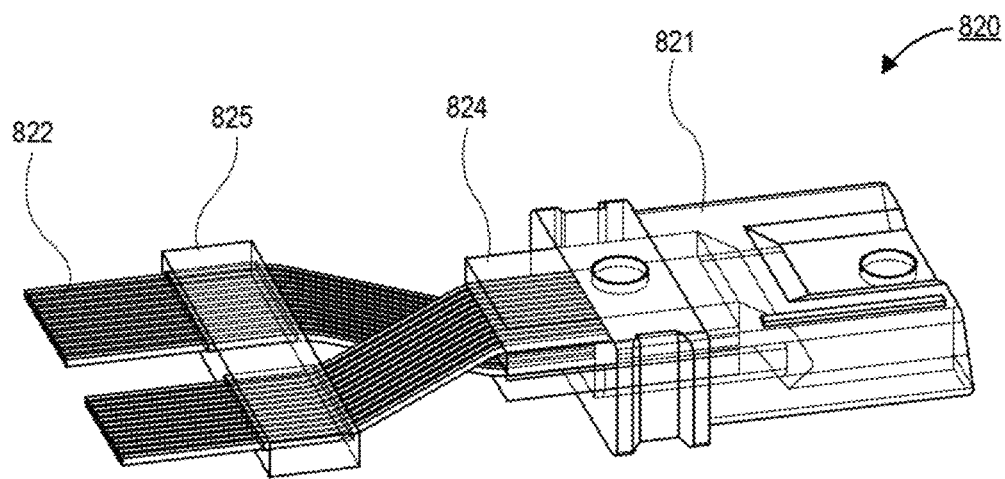
FIG. 8A is a perspective view of an optical connector, in accordance with an embodiment.

Embodiments disclosed herein may also provide for improved manufacturability and reliability. An example of an optical connector 820 is shown in FIG. 8A. The optical connector 820 comprises a socket 821 (also sometimes referred to as a plug). A ferrule 824 is inserted into the socket 821, and a holder 825 is spaced away from the ferrule 824. The holder 825 maintains fibers 822 at the proper alignment for insertion into V-grooves on an optics die. The fibers 822 may be arranged in a 2×12 alignment in the ferrule 824 and a 1×24 alignment in the holder 825. Between the holder 825 and the ferrule 824 the fibers are bent to accommodate the different alignments on each end.

However, such an architecture provides several drawbacks. One drawback is that insertion of the fibers 822 into V-grooves requires complex pick-and-place tools. Particularly, the pick-and-place tool requires at least three different tips. A first tip is needed to control the socket 821 and ferrule 824, a second tip is needed to control the holder 825, and a third tip is needed to hold a fiber lid to press the ends of the fibers 822 into the V-grooves. Additionally, the portions of the fibers 822 between the ferrule 824 and the holder 825 are exposed to thermal and mechanical shock. As such, the optical connector 820 is susceptible to environmental damage during and after installation. Accordingly, embodiments disclosed herein provide an enhanced optical connector 820 that mitigates the drawbacks of the optical connector 820 illustrated in FIG. 8A. Such an optical connector 820 is illustrated in FIG. 8B.

Figure 8B:
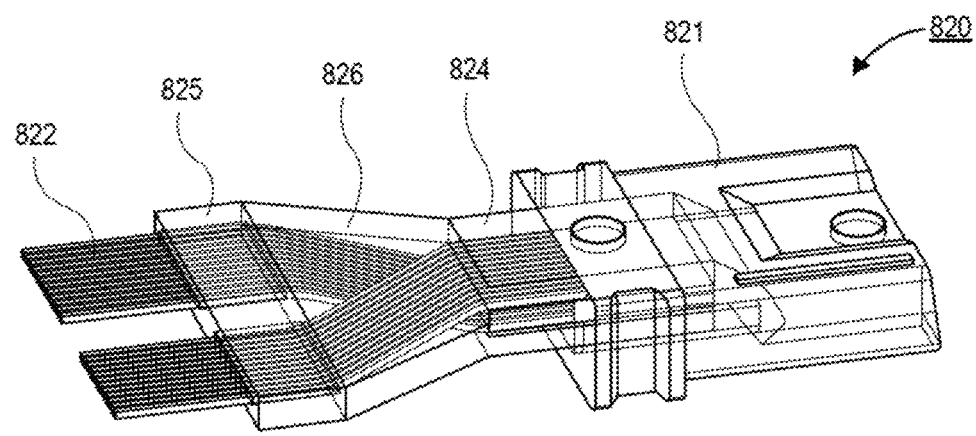
FIG. 8B is a perspective view of an optical connector with a fiber distribution housing, in accordance with an embodiment.

Referring now to FIG. 8B, a perspective view illustration of an optical connector 820 is shown, in accordance with an embodiment. In an embodiment, the optical connector 820 comprises a socket 821. The socket 821 may be substantially similar to the socket 821 illustrated in FIG. 8A. That is, the socket 821 may be configured to receive a ferrule 824. In an embodiment, the ferrule 824 receives the optical fibers 822 and holds them in a 2×24 arrangement. Though, it is to be appreciated that different optical fiber 822 arrangements can be used, depending on the number of optical fibers 822 in the connector 820.

In an embodiment, the optical connector 820 may also comprise a holder 825 that is similar to the holder 825 in FIG. 8A. The holder 825 may secure the optical fibers 822 in an arrangement that is different than the arrangement of the optical fibers in the ferrule 824. In an embodiment, the holder 825 arranges the optical fibers 822 in a single row. For example, in the case of a twenty four optical fiber 822 optical connector 820, the optical fibers 822 may be positioned in a 1×24 arrangement.

The optical connector 820 in FIG. 8B differs from the optical connector 820 in FIG. 8A in that a fiber distribution housing 826 is provided between the ferrule 824 and the holder 825. In an embodiment, the fiber distribution housing 826 may be the same material as one or both of the ferrule 824 and the holder 825. For example, the fiber distribution housing 826, the ferrule 824, and the holder 825 may each comprise glass. In such embodiments, the fiber distribution housing 826, the ferrule 824, and the holder 825 may be a monolithic part. That is, in some embodiments, there may be no discernable seam or other boundary between the fiber distribution housing 826, the ferrule 824, and the holder 825. However, in other embodiments, seams may be present between two or more of the fiber distribution housing 826, the ferrule 824, and the holder 825, even when formed from the same material. In yet another embodiment, two or more of the fiber distribution housing 826, the ferrule 824, and the holder 825 may be formed with different materials.

The fiber distribution housing 826 provides an enclosure around the optical fibers 822 as they are bent to allow conversion from one arrangement at the ferrule 824 to a second arrangement at the holder 825. For example, the optical fibers 822 may be bent so that at the ferrule 824 the optical fibers 822 are arranged in two or more rows (e.g., a 2×12 array) and at the holder 825 the optical fibers 822 are arranged in a single row (e.g., a 1×24 array).

In an embodiment, the fiber distribution housing 826 entirely surrounds the optical fibers 822. As such, the optical fibers 822 are less susceptible to thermal or mechanical shock. Additionally, the fiber distribution housing 826 mechanically couples the ferrule 824 to the holder 825. As such, a tip for the pick-and-place tool for mounting the optical connector 820 to the V-grooves on the optics die may be omitted.

Figure 8C:
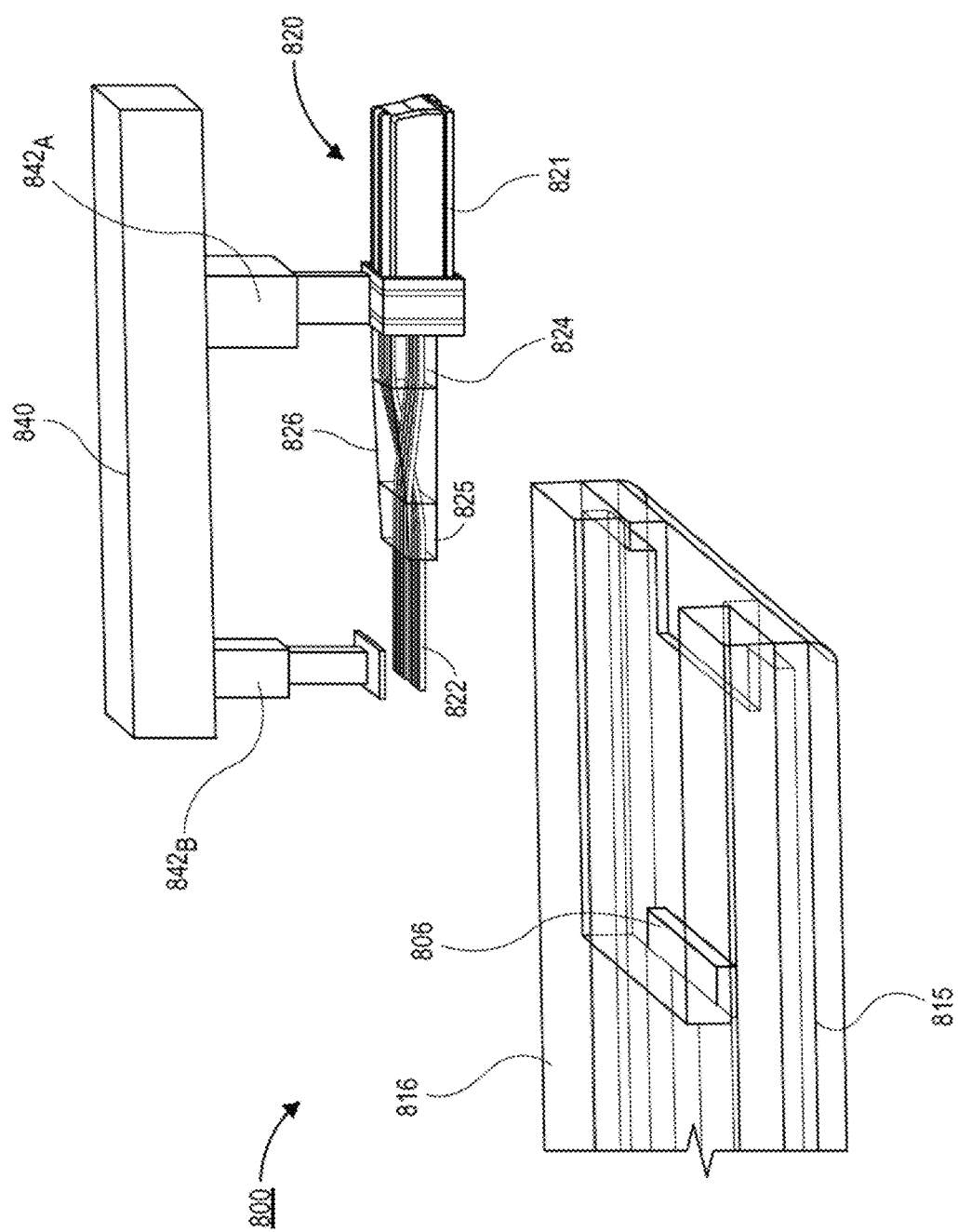
FIG. 8C is a perspective view of a pick-and-place tool for connecting the optical connector to an optics die, in accordance with an embodiment.

Referring now to FIG. 8C, a perspective view illustration of the assembly of an optical package 800 is shown, in accordance with an embodiment. As shown, the optical package 800 may comprise a package substrate 816 and an integrated heat spreader 815. A recess in the package substrate 816 may result in the exposure of an edge of one or more optics dies 806 that are attached to the package substrate 816. The optics dies 806 may comprise V-grooves for receiving optical fibers 822 of the optical connector 820.

As shown, the optical connector 820 may be substantially similar to the optical connector 820 in FIG. 8B. For example, the optical connector 820 comprises a socket 821, a ferrule 824, a fiber distribution housing 826, a holder 825, and optical fibers 822. The optical connector 820 may be handled by a pick-and-place tool 840. The pick-and-place tool 840 may comprise a first tip 842$_A$ and a second tip 842$_B$. The first tip 842$_A$ may hold the socket 821. The fiber distribution housing 826 mechanically couples the holder 825 to the ferrule 824 that is held by the socket 821. As such, only a single first tip 842$_A$ is needed to handle these components of the optical connector 820. In contrast, the optical connector 820 in FIG. 8A requires an additional tip in order to properly align the holder 825 since it is not mechanically coupled to the ferrule 824. In an embodiment, the second tip 842$_B$ may be arranged to handle the bare ends of the optical fibers 822. The second tip 842$_B$ is therefore responsible for holding a fiber lid to press in the bare ends of the optical fibers 822 into the V-grooves on the optics dies 806.

The embodiments described above may include the fluidic dispensing of one or more materials in order to allow for proper coupling of components and/or sealing of cavities. For example, the compute die and the optics dies typically include underfill materials, an epoxy may be needed to secure the bare optical fibers to the V-grooves, and sealant may be dispensed to fully seal the cavity formed by the package substrate recess. It is to be appreciated that the control of the various flows of one or more of such fluids is critical in order to provide high yielding and robust optics packages. Accordingly, embodiments disclosed herein include various micro channels into surfaces where such fluids are dispensed in order to control the spread of the materials.

Figure 9A:
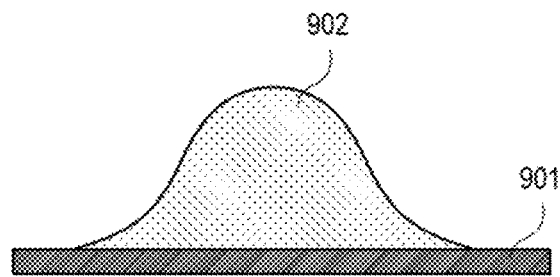
FIGS. 9A-9E are illustrations depicting the control of a fluid on an optics package using micro channels, in accordance with an embodiment.

Referring now to FIG. 9A, a cross-sectional illustration of a fluid 902 dispensed on a surface 901 is shown, in accordance with an embodiment. With the inclusion of no micro channels or other features, the fluid 902 is distributed as viscosity and surface tensions dictate. For example, the fluid 902 may have a cross-section that follows a normal distribution.

Figure 9B:
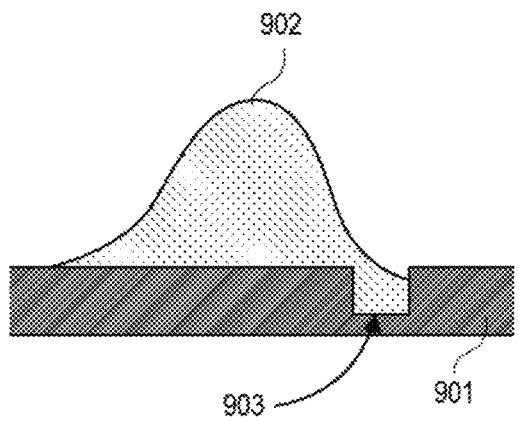

Referring now to FIG. 9B, a cross-sectional illustration of a fluid 902 dispensed on a surface 901 with a micro patterned channel 903 is shown, in accordance with an embodiment. As shown, the channel 903 interrupts the natural flow of the fluid and truncates a tail of the fluid. Such a channel 903 can therefore be used to halt the flow of a fluid across a surface. In the illustrated embodiment, a single channel 903 is shown, but it is to be appreciated that multiple channels 903 may be provided next to each other to further enhance control of the fluid across the channels.

Figure 9C:
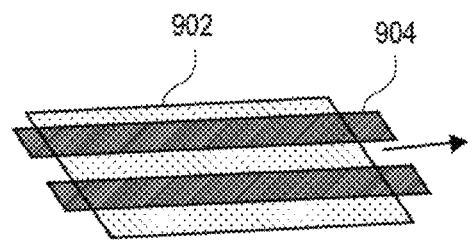

In contrast, FIG. 9C is an illustration of channels 904 that are formed into a surface that coincide with the primary flow direction of a fluid 902 (as indicated by the arrow). As shown, the guiding channels 904 promote flow of the fluid 902 along the path dictated by the channels 904. In the illustrated embodiment a pair of parallel channels 904 are shown. However, it is to be appreciated that a single guiding channel 904 or a plurality of guiding channels may be provided to modify the flow of the fluid 902.

Figure 9D:
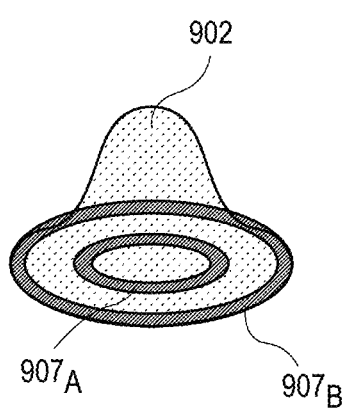

In FIGS. 9B and 9C, the channels 903 and 904 are shown as being substantially straight lines. However, it is to be appreciated that the channels may not be linear in some embodiments. For example, in FIG. 9D an illustration of a circular channel 907 is shown, in accordance with an embodiment. The use of a circular channel 907 may be used to confine a fluid 902 to a given area. In an embodiment, a single circular channel 907 may be sufficient to confine a fluid 902. However, in other embodiments, two or more circular channels (e.g., a first circular channel $907_A$ and a second circular channel $907_B$) may be used to confine the flow of a fluid 902. Additionally, while shown as being circular channels 907, it is to be appreciated that any shaped closed loop channel may be used in other embodiments.

Figure 9E:
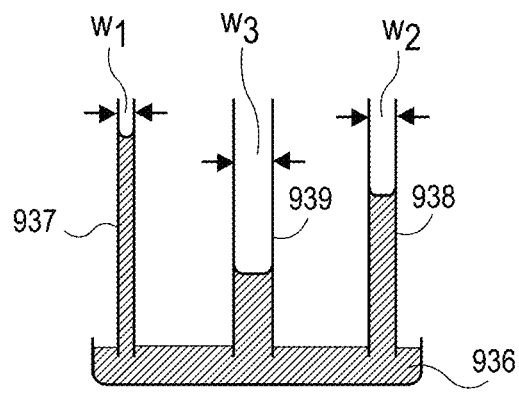

Referring now to FIG. 9E, a plan view illustration of a fluid distribution structure is shown, in accordance with an embodiment. As shown, the fluid may be dispensed into a main reservoir 936 and a plurality of branches 937, 938, 939 may intersect the main reservoir 936. The various branches 937, 938, 939 have different widths $W_1$, $W_2$, and $W_3$, respectively. Depending on the width W, different amounts of capillary force will draw the fluid to different distances away from the reservoir 936. For example, the first width $W_1$ is the smallest and results in the greatest distance of fluid transfer, and the third width $W_3$ is the largest and results in the shortest distance of fluid transfer.

In FIGS. 9B-9E, the various channels are referred to as being "micro channels". A micro channel may refer to features (e.g., width and/or depth) of the channel being at the micron scale. For example, the width and/or depth of the micro channels may be approximately 500 μm or less, approximately 100 μm or less, or approximately 10 μm or less, depending on the fluid that is being dispensed. Additionally, it is to be appreciated that lengths of the micro channels may be several millimeters or longer. That is the length of the micro channels may not be considered as being on the micron scale in some embodiments.

Figure 9F:
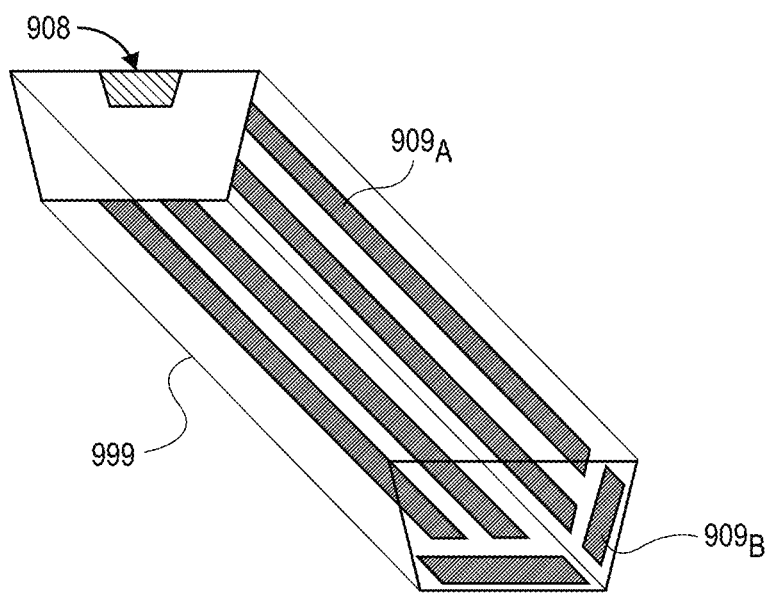
FIG. 9F is an illustration of a V-groove that comprises micro channels for controlling the flow of an epoxy for securing a fiber, in accordance with an embodiment.

Referring now to FIG. 9F, a perspective view illustration of a V-groove 999 is shown, in accordance with an embodiment. A first end of the V-groove 999 may comprise a spot size converter (SCC) 908. The opposite end of the V-groove 999 may be at the end of the optics die (not shown). In an embodiment, a plurality of parallel channels 909A extend along a length direction of the V-groove 999. In an embodiment, the channels 909A may be provided on one or more surfaces of the V-groove 999. For example, the channels 909A may be provided on sidewall surfaces and/or the bottom surface of the V-groove 999. The channels 909A allow for optical epoxy to evenly distribute under a fiber (not shown) and flow under the SSC 908. In an embodiment, second channels 909B may be provided at the end of the V-groove 999 opposite from the SSC 908. The second channels 909B may be substantially orthogonal to the channels 909A. Such a configuration prevents overflow of epoxy outside of the V-groove 999 and forces more fluid flow towards the SSC 908.

Figure 10A:
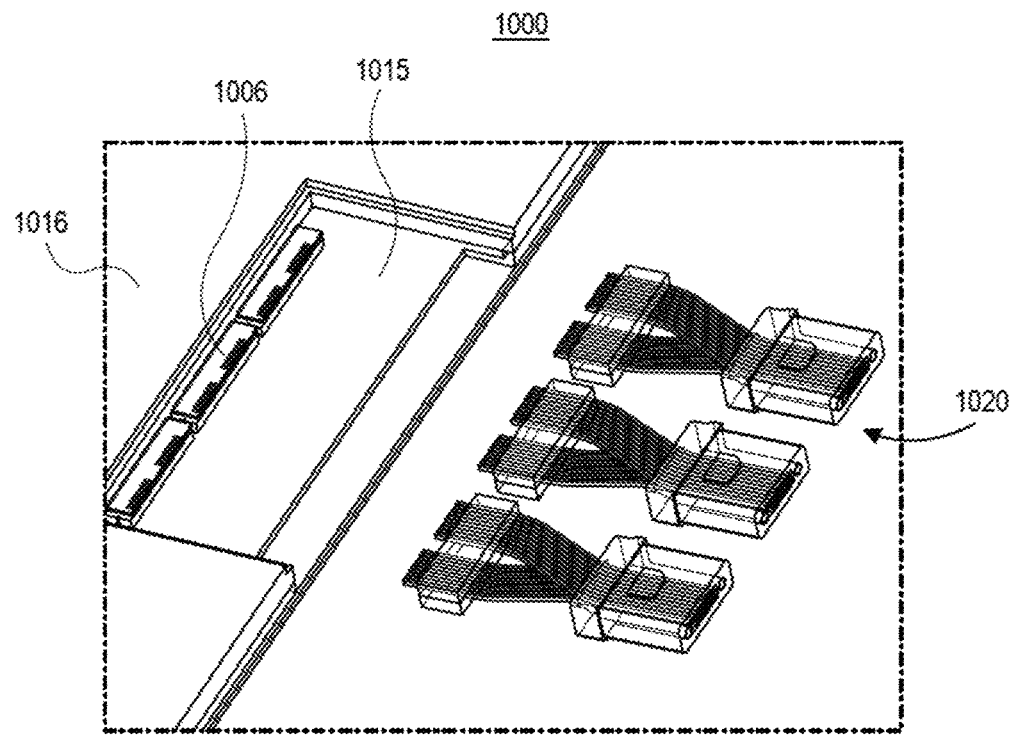
FIG. 10A is a perspective view illustration of an optics package with a recess in the package substrate to expose a portion of the IHS, in accordance with an embodiment.

Referring now to FIG. 10A, a perspective view illustration of an optical package 1000 is shown, in accordance with an embodiment. As shown, the optical package 1000 comprises an IHS 1015 and a package substrate 1016. Portions of the optics dies 1006 are exposed by a recess in the package substrate 1016. The optical connectors 1020 are removed from the recess to more clearly illustrate exposed surfaces of the IHS 1015. However, it is to be appreciated that the optical connectors 1020 are attached to the IHS 1015 by a mechanical epoxy. It is desirable for this epoxy to not overflow outside of the package and to be evenly distributed. As such, the surfaces of the IHS 1015 exposed by the recess in the package substrate 1016 may comprise micro channels to control the flow of the epoxy.

Figure 10B:
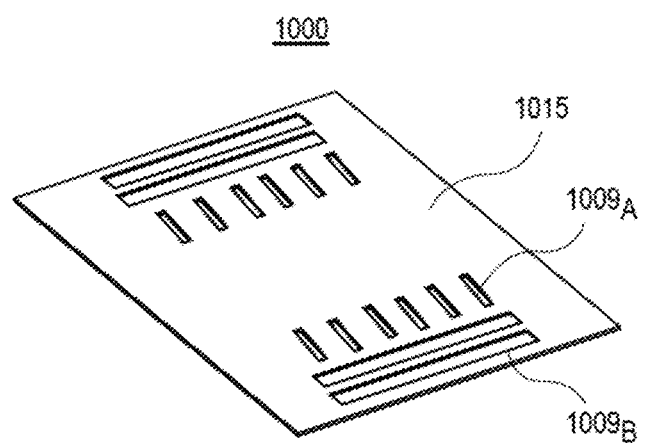
FIG. 10B is an illustration of the IHS with micro channels for controlling the flow of a sealant, in accordance with an embodiment.

Referring now to FIG. 10B, an illustration of the IHS 1015 in isolation from the remainder of the optical package 1000 is shown, in accordance with an embodiment. As shown, the IHS 1015 may comprise a first set of parallel channels $1009_A$. The first set of parallel channels $1009_A$ may be used to evenly distribute the epoxy in the recess region. One or more second channels $1009_B$ may be provided along an edge of the IHS 1015. The second channels $1009_B$ may be substantially perpendicular to the first set of parallel channels $1009_A$. The second channels $1009_B$ prevent the flow of the epoxy off the edge of the IHS 1015.

Figure 10C:
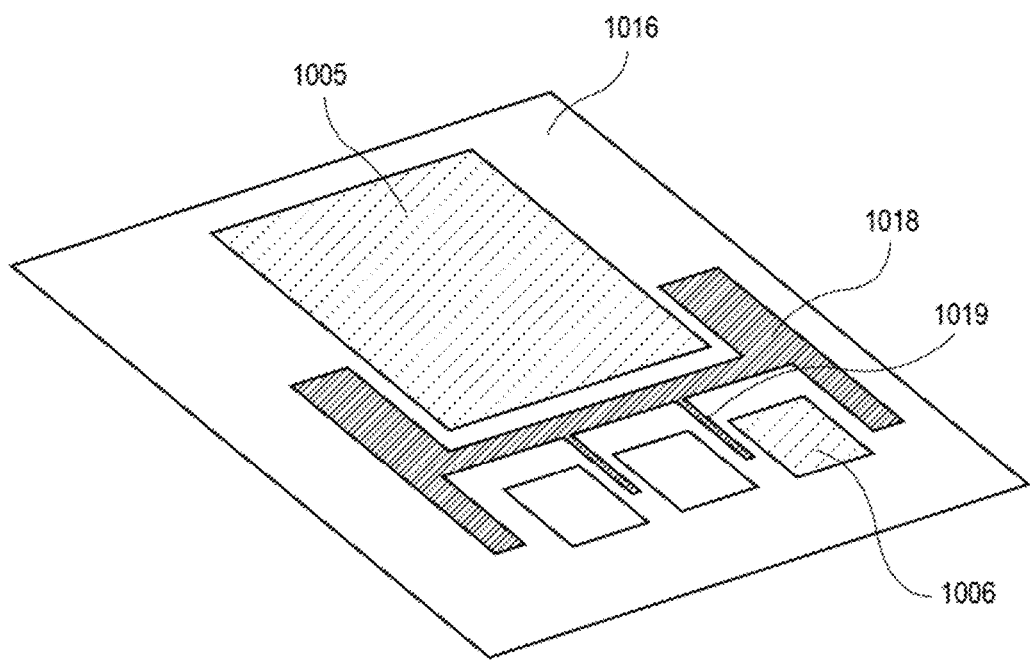
FIG. 10C is an illustration of a package substrate with micro channels to control the flow of underfill material around the compute die and the optics dies, in accordance with an embodiment.

Referring now to FIG. 10C, an illustration of the package substrate 1016 with a compute die 1005 and optics dies 1006 is shown, in accordance with an embodiment. In an embodiment, keep out zones surrounding the optics dies 1006 and the compute die 1005 may be provided. The keep out zones are areas of the package substrate 1016 that should remain free of underfill material. As such, channels 1019 may be provided between the keep out zones. The channels 1019 may be fluidically coupled to reservoirs 1018. As such, excess underfill material flows into the channels 1019 and is transported to the reservoirs 1018 through capillary action. Therefore, precise control of the underfill in order to maintain proper keep out zones is provided.

In the embodiments described above, the optical connector is described as interfacing with the optics die through V-grooves. However, it is to be appreciated that in other embodiments, the optical connector may be optically coupled to the optics die from above. In such an embodiment, a grating coupler may be provided on the optics die to receive optical signals from a fiber coming down towards the optics die from above. In some instances that fibers are routed to a ferrule using a fiber shuffler or a loom. However, such architectures occupy a large area on the footprint of the printed circuit board (PCB) and are therefore not desirable.

Accordingly, embodiments disclosed herein include an optical coupler that has a reduced footprint. In an embodiment, the optical coupler may be supported by pillars that are on the package substrate or the PCB. The pillars are smaller than previous solutions, and therefore save valuable package or board real estate.

Figure 11A:
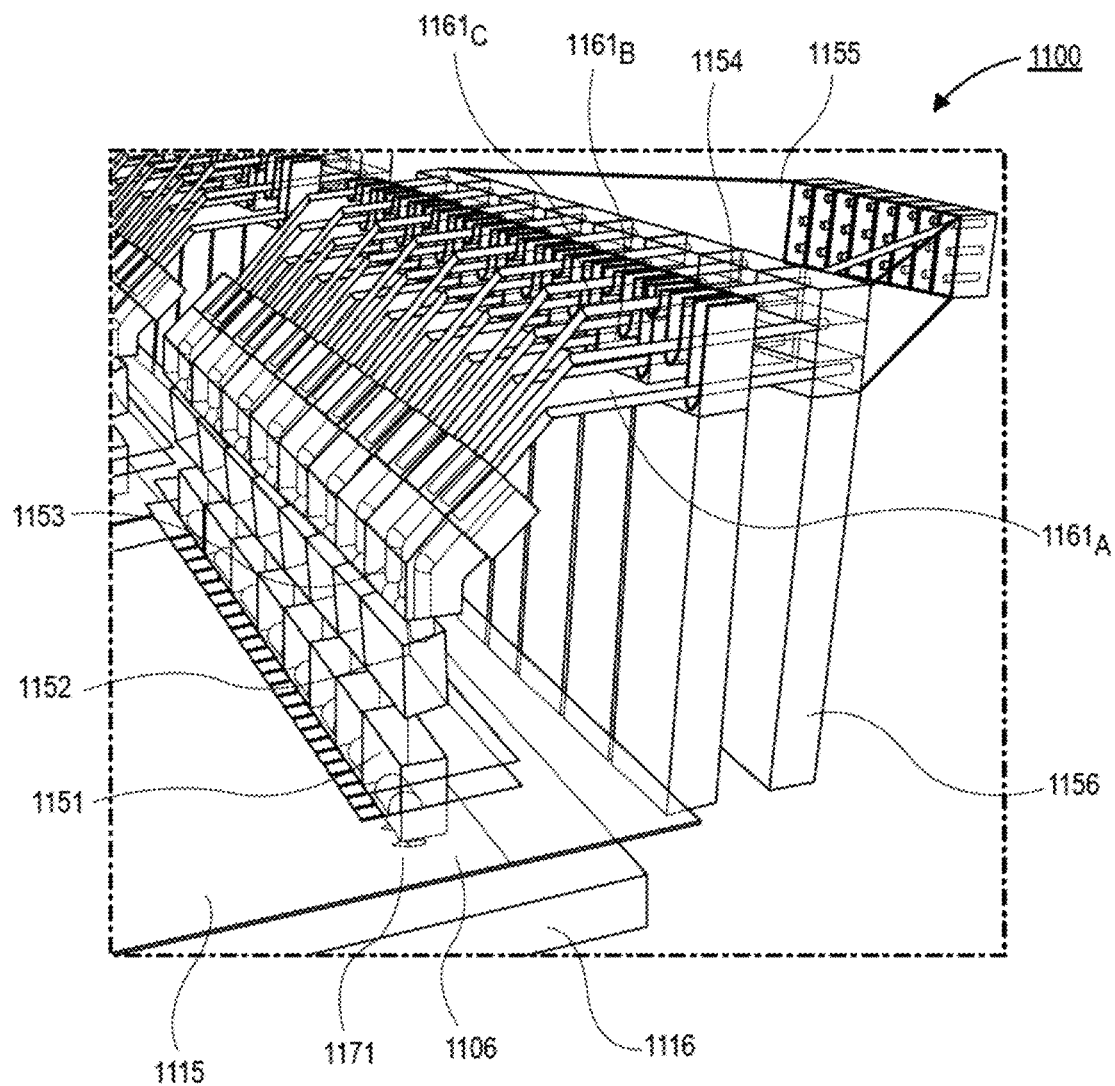
FIG. 11A is a perspective view illustration of an optical connector with integrated fiber shuffle coupling to an optical coupler on an optical chip, in accordance with an embodiment.

Referring now to FIG. 11A, a perspective view illustration of a portion of an optics package 1100 is shown, in accordance with an embodiment. In an embodiment, the optics package 1100 comprises a package substrate 1116 and an optics die 1106 over the package substrate 1116. A grating coupler 1171 may be provided on the optics die 1106 to receive optical signals. The optics package 1100 may further comprise an IHS 1115 over the optics die 1106. The IHS 1115 may comprise an opening to allow for optical signals to pass through the IHS 1115.

In an embodiment, the optical coupler comprises a fiber array unit (FAU) 1153. The FAU 1153 bends the optical fibers 1161. For example, the bend provided by the FAU 1153 may be approximately 125°. After exiting the FAU 1153, the fibers 1161 pass through a fiber shuffler 1154. The fiber shuffler 1154 redistributes the fibers 1161 to different Z-heights. For example, fiber 1161A is at a first Z-height, fiber 1161B is at a second Z-height that is above the first Z-height, and fiber 1161C is at a third Z-height that is above the second Z-height. After exiting the fiber shuffler 1154, the fibers 1161 enter a ferrule 1155. The ferrule 1155 routes the fibers 1161 so they are arranged into a column. That is, the third fiber 1161C is directly above the second fiber 1161B, and the second fiber 1161B is directly above the first fiber 1161A. Accordingly, the optical coupler may translate a row into a column. In an embodiment, the fiber shuffler 1154 and the ferrule 1155 may be supported from below by pillars 1156. The pillars 1156 may be supported by the PCB (not shown) or by a portion of the package substrate 1116. In the illustrated embodiment, the FAU 1153, the optical fibers 1161, the fiber shuffler 1154, and the ferrule 1155 are shown as discrete components. However, it is to be appreciated that the FAU 1153, the optical fibers 1161, the fiber shuffler 1154, and the ferrule 1155 may be molded together as a single component.

The optical coupler described above highlights the coupling of a set of three fibers $1161_{A-C}$. However, the optical coupler may provide translation of a plurality of optical fibers 1161. For example, in FIG. 11A, a 1×24 row of fibers 1161 is translated into a 3×8 array at the end of the ferrule 1155.

In an embodiment, the fibers 1161 may be optically coupled to the grating coupler 1171 by lenses 1152 and 1151. Lens 1152 may be coupled to the FAU 1153, and lens 1151 may be coupled to the optics die 1106. As such, optical signals from the fibers 1161 may be focused onto the grating couplers 1171 of the optics die 1106. However, it is to be appreciated that one or both of the lenses 1152 and 1151 may be omitted in some embodiments.

Figure 11B:
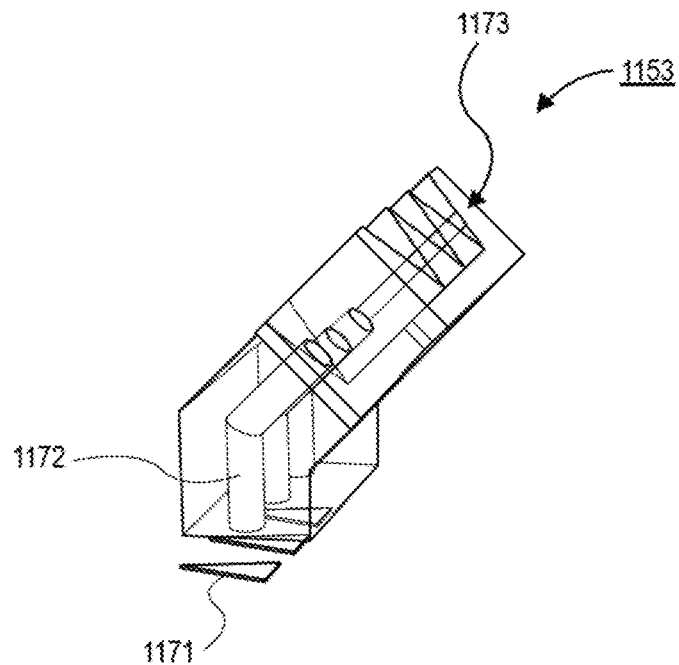
FIG. 11B is a perspective view illustration of a fiber array unit (FAU) of the optical connector, in accordance with an embodiment.

Referring now to FIG. 11B, a perspective view illustration of an FAU 1153 is shown, in accordance with an embodiment. As shown, the FAU 1153 may comprise a housing for guiding the fibers (not shown) towards a grating coupler 1171 on an optics die (not shown). Channels 1172 may be formed in a bottom portion of the FAU 1153 to receive the fibers. The channels 1172 may be completely surrounded by the housing of the FAU 1153. In an embodiment, the channels 1172 may comprise a bend in order to change the path of the fibers. For example, the bend in the channels 1172 may be approximately 125°. In the upper portion of the FAU 1153, V-grooves 1173 may be provided. The V-grooves provide an alignment feature that allows for fibers to be properly inserted into the channels 1172.

In the illustrated embodiment, the FAU 1153 is shown with paths for three fibers. However, it is to be appreciated that the components of the FAU 1153 may be repeated any number of times in order to provide an FAU 1153 that accommodates architectures with more fibers. For example, the FAU 1153 may comprise twenty four paths for fibers.

Figure 11C:
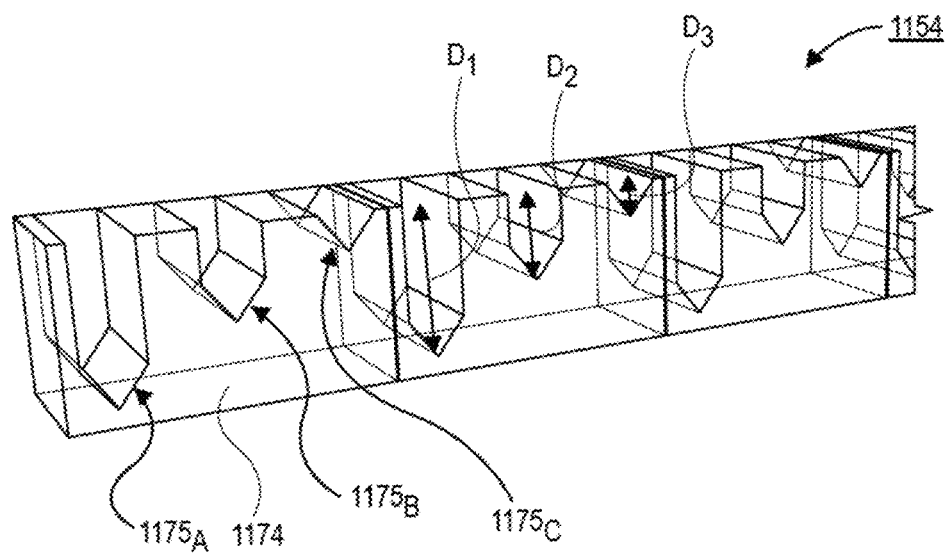
FIG. 11C is a perspective view illustration of a fiber shuffler of the optical connector, in accordance with an embodiment.

Referring now to FIG. 11C, a perspective view illustration of a fiber shuffler 1154 is shown, in accordance with an embodiment. In an embodiment, the fiber shuffler 1154 comprises a main body 1174. A plurality of trenches 1175 are provided into the main body 1174. Each of the trenches 1175 may have a V-groove bottom in order to properly align the fibers (not shown). In an embodiment, the trenches 1175 may have two or more different depths. For example, trenches $1175_A$ have a first depth $D_1$, trenches $1175_B$ have a second depth $D_2$, and trenches $1175_C$ have a third depth $D_3$. The difference in the depths allow for the fibers to be aligned at different heights within the system. In an embodiment, a rigid plate with protrusions or the like (not shown) may press the fibers into the V-groove bottoms.

In the illustrated embodiment, each set of trenches (e.g., trenches $1175_A$-$1175_C$) includes three trenches. The sets of trenches 1175 may be repeated any number of times in order to accommodate any number of fibers. For example, eight sets of trenches 1175 may be used to accommodate a system that comprises twenty four fibers. Additionally while sets with three trenches 1175 are shown, it is to be appreciated that each set may comprise two or more trenches 1175.

Figure 11D:
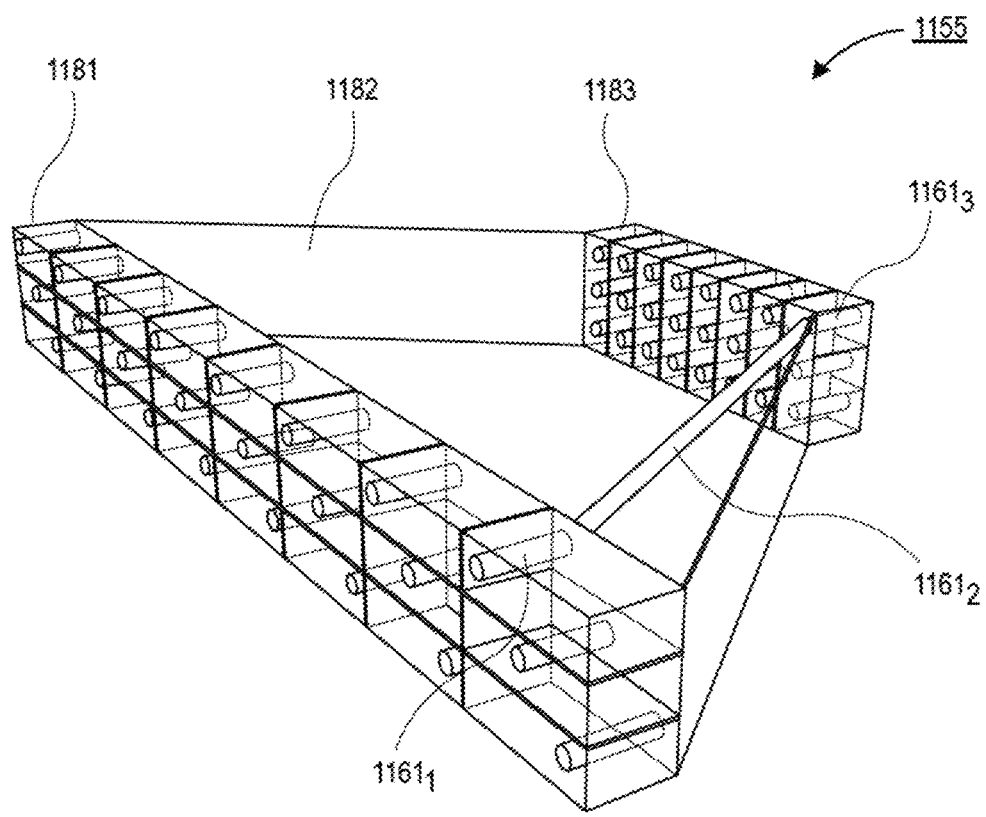
FIG. 11D is a perspective view illustration of a ferrule of the optical connector, in accordance with an embodiment.

Referring now to FIG. 11D, a perspective view illustration of a ferrule 1155 is shown, in accordance with an embodiment. In an embodiment, the ferrule 1155 comprises a first end 1181 and a second end 1183. A fiber realignment region 1182 is provided between the first end 1181 and the second end 1183. A single fiber 1161 passing through the fiber realignment region 1182 is show for simplicity. However, it is to be appreciated that the all of the fibers 1161 pass through the fiber realignment region 1182 in some embodiments.

As shown in FIG. 11D, for each set of three fibers 1161, the first end of the fibers $1161_1$ are not aligned. This is because the fiber shuffler 1154 has set different Z-heights for the fibers 1161. Additionally, no lateral displacement has taken place at this point, so the fibers 1161 within a set are not aligned above/below each other. During the transition from the first end 1181 to the second end 1183, the fibers $1161_2$ are laterally displaced so that the second end of the fibers $1161_3$ are aligned in a column. As such, the combination of the FAU 1153, the fiber shuffler 1154, and the ferrule 1155 allow for the conversion of a row of fibers into a multi column array. For example, the fibers may be converted from a 1×24 array to a 3×8 array in some embodiments.

Figure 11E:
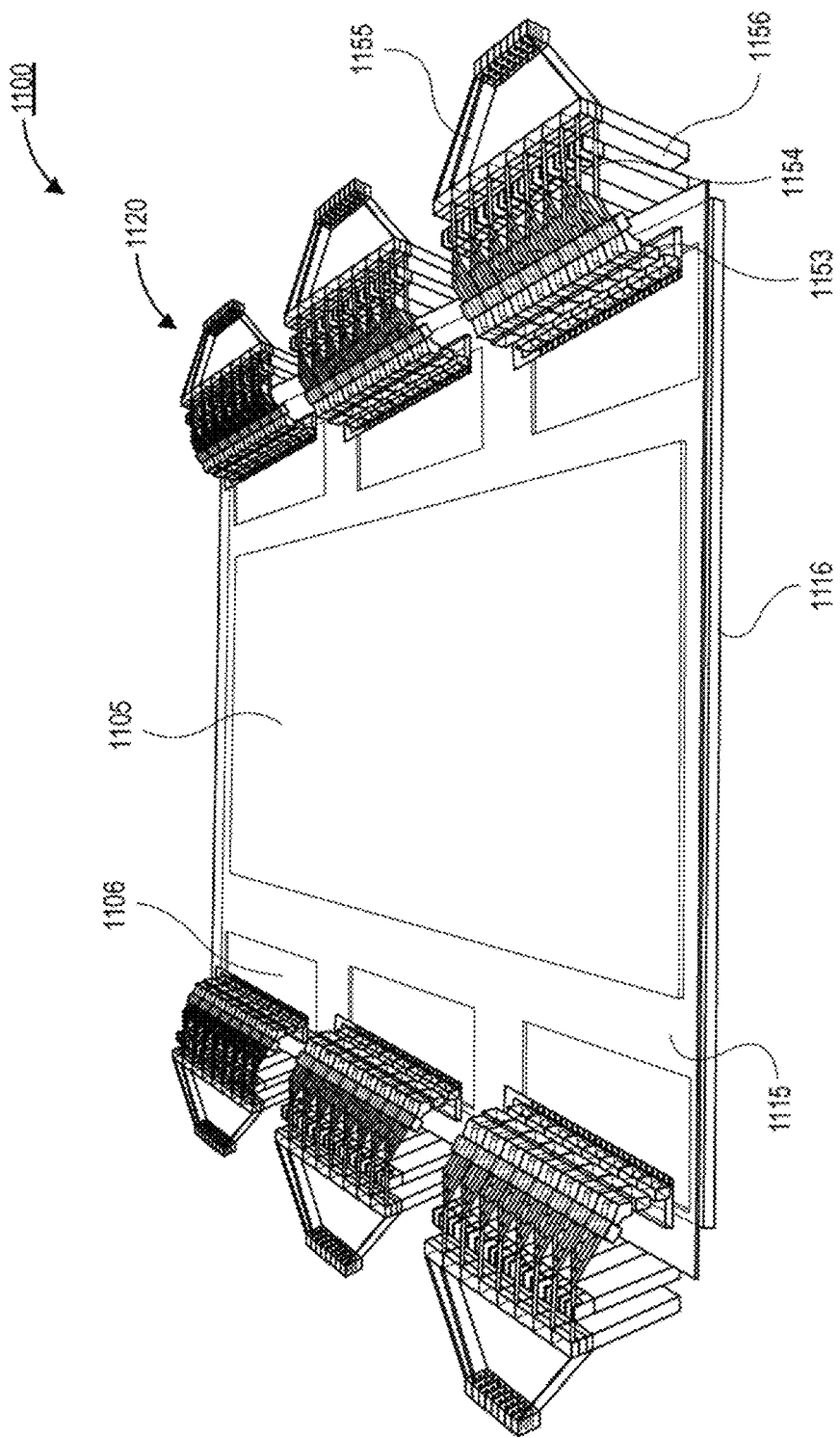
FIG. 11E is a perspective view illustration of an optical package with optical connectors, in accordance with an embodiment.

Referring now to FIG. 11E, a perspective view illustration of an optical package 1100 is shown, in accordance with an embodiment. As shown, the optical package 1100 comprises a package substrate 1116 and an IHS 1115. A compute die 1105 and optics dies 1106 are provided between the package substrate 1116 and the IHS 1115. Each of the optics dies 1106 are optically coupled to an optical connector 1120. For example, six optical connectors 1120 are shown in FIG. 11E. However, it is to be appreciated that there may be any number of optical connectors 1120 to match the number of optics dies 1106.

In an embodiment, each of the optical connectors 1120 may comprise a FAU 1153, a fiber shuffler 1154, and a ferrule 1155. The ferrule 1155 and the fiber shuffler 1154 may be supported by pillars 1156. The pillars 1156 may be attached to a board (not shown) that is below the package substrate 1116. In other embodiments, the package substrate 1116 may extend out and provide the support for the pillars 1156.

Figure 12:
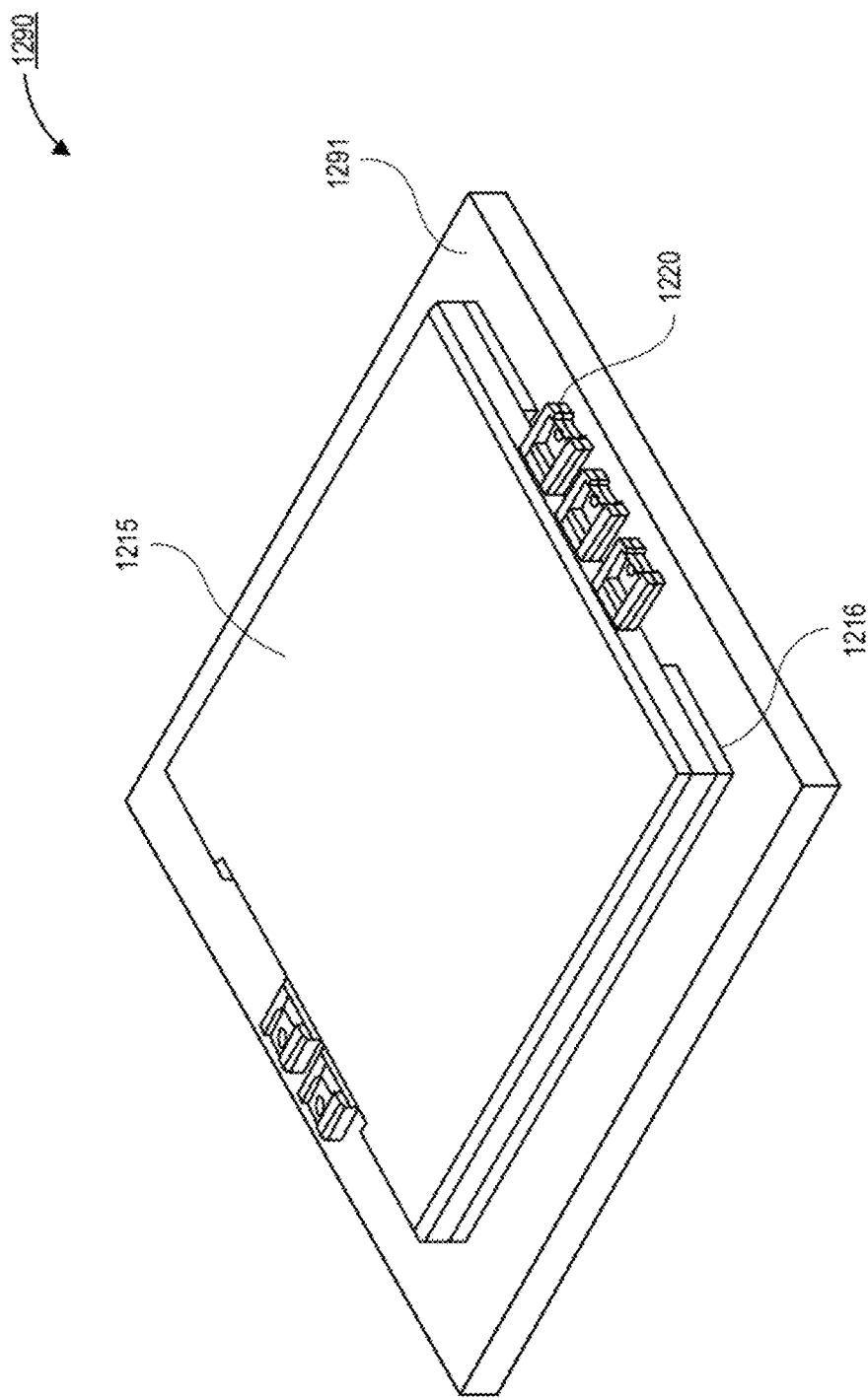
FIG. 12 is a perspective view illustration of an optics system, in accordance with an embodiment.

Referring now to FIG. 12, a perspective view illustration of an optical system 1290 is shown, in accordance with an embodiment. In an embodiment, the optical system 1290 comprises a board 1291, such as a PCB. A package substrate 1216 may be attached to the board 1291. An IHS 1215 may be provided over the package substrate 1216. In an embodiment, a compute die (not shown) and a plurality of optics dies (not shown) are provided between the IHS 1215 and the package substrate 1216. Optical connectors 1220 may be optically coupled to the optics dies.

In an embodiment, the optical system 1290 may comprise any of the embodiments described above. For example, a lid covering a recess in the package substrate may be provided. A sealant epoxy may also be provided to seal the cavity below the lid in some embodiments. Additionally, the optical connector 1220 may comprise a molded fiber distribution housing between a holder and the ferrule. Embodiments may also include one or more micro channels on various surfaces in order to control the dispensing of various materials. For examples, micro channels may be provided on the IHS 1215, the package substrate 1216, or on V-grooves of the optics dies.

In the illustrated embodiment, the optical connectors 1220 exit from the side of the optical system. However, it is to be appreciated that optical connectors similar to those described in FIGS. 11A-11E may replace the illustrated optical connectors 1220. In such an embodiment, holes through the IHS 1215 may be provided to allow access to grating couplers on the optics dies. In an embodiment, such vertical optical connectors may comprise an FAU, a fiber shuffler, and a ferrule.

Figure 13:
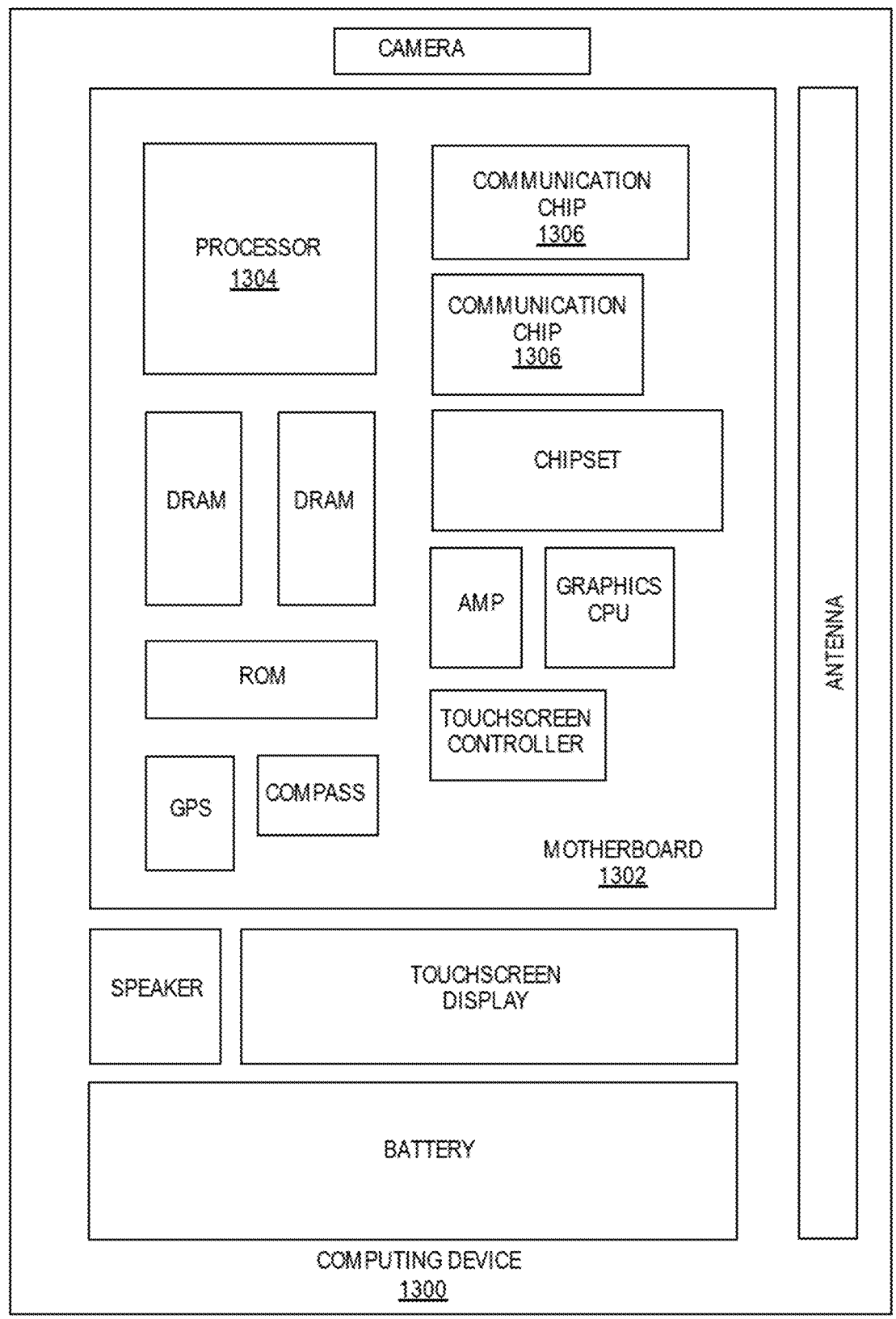
FIG. 13 is a schematic of a computing device built in accordance with an embodiment.

FIG. 13 illustrates a computing device 1300 in accordance with one implementation of the invention. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the invention, the integrated circuit die of the processor may be part of an optical package that comprises optical connectors coupled to optics dies, in accordance with embodiments described herein. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the invention, the integrated circuit die of the communication chip may be part of an optical package that comprises optical connectors coupled to optics dies, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an optical package, comprising: a package substrate; a compute die on the package substrate; an optics die on the package substrate; and an integrated heat spreader (IHS) over the compute die and the optics die, wherein channels are disposed on a surface of the IHS facing the package substrate.

Example 2: the optical package of Example 1, wherein the channels comprise: a first channel running in a first direction; and a second channel running in a second direction that is substantially orthogonal to the first direction.

Example 3: the optical package of Example 1, wherein the channels comprise: a first ring channel; and a second ring channel surrounding the first ring channel.

Example 4: the optical package of Example 1, wherein the channels comprise: a first channel extending in a first direction; a second channel intersecting the first channel, wherein the second channel has a first width; and a third channel intersecting the first channel, wherein the third channel has a second width.

Example 5: the optical package of Examples 1-4, wherein the package substrate comprises a recess along an edge.

Example 6: the optical package of Example 5, wherein the channels are positioned over the recess in the package substrate.

Example 7: the optical package of Examples 1-6, further comprising: an optical connector coupled to the optics die.

Example 8: the optical package of Example 7, further comprising: a sealant around the optical connector, wherein the sealant at least partially fills the channels.

Example 9: the optical package of Examples 1-8, further comprising: a channel in the package substrate.

Example 10: the optical package of Example 9, wherein the channel is between the compute die and the optics die.

Example 11: a photonics die, comprising: a die substrate; a V-groove in the die substrate; and a channel into a surface of the V-groove.

Example 12: the photonics die of Example 11, wherein the V-groove has a length direction, and wherein the channel extends along the length direction.

Example 13: the photonics die of Example 11 or Example 12, wherein the V-groove has a first end and a second end at the edge of the die substrate, and wherein a spot size converter is at the first end of the V-groove.

Example 14: the photonics die of Example 13, wherein the channel extends between the first end and the second end, and wherein a second channel is provided between the channel and the second end.

Example 15: the photonics die of Example 14, wherein the second channel extends in a length direction that is substantially perpendicular to a length direction of the channel.

Example 16: the photonics die of Examples 11-15, further comprising: a plurality of channels into surfaces of the V-groove, wherein the plurality of channels run substantially parallel to each other.

Example 17: the photonics die of Example 16, wherein the plurality of channels are disposed into a first sidewall of the V-groove and a second sidewall of the V-groove.

Example 18: an optical system, comprising: a board; a package substrate on the board; a compute die on the package substrate; an optics die on the package substrate; and an integrated heat spreader (IHS) over the compute die and the optics die, wherein channels are disposed on a surface of the IHS facing the package substrate.

Example 19: the optical system of Example 18, wherein the package substrate comprises a recessed edge, and wherein the channels are disposed over the recess.

Example 20: the optical system of Example 18 or Example 19, wherein the optics die comprises a V-groove, and wherein a second channel is disposed into a surface of the V-groove.

What is claimed is:

1. An optical package, comprising:
   a package substrate, wherein a channel is in the package substrate;
   a compute die on the package substrate;
   an optics die on the package substrate; and
   an integrated heat spreader (IHS) over the compute die and the optics die, wherein channels are disposed on a surface of the IHS facing the package substrate.

2. The optical package of claim 1, wherein the channels comprise:
   a first channel running in a first direction; and
   a second channel running in a second direction that is substantially orthogonal to the first direction.

3. The optical package of claim 1, wherein the channels comprise:
   a first ring channel; and
   a second ring channel surrounding the first ring channel.

4. The optical package of claim 1, wherein the channels comprise:
   a first channel extending in a first direction;
   a second channel intersecting the first channel, wherein the second channel has a first width; and
   a third channel intersecting the first channel, wherein the third channel has a second width.

5. The optical package of claim 1, wherein the package substrate comprises a recess along an edge.

6. The optical package of claim 5, wherein the channels are positioned over the recess in the package substrate.

7. The optical package of claim 1, further comprising:
   an optical connector coupled to the optics die.

8. The optical package of claim 7, further comprising:
   a sealant around the optical connector, wherein the sealant at least partially fills the channels.

9. The optical package of claim 1, wherein the channel is between the compute die and the optics die.

10. A photonics die, comprising:
    a die substrate;
    a V-groove in the die substrate; and
    a channel into a surface of the V-groove.

11. Photonics die of claim 10, wherein the V-groove has a length direction, and wherein the channel extends along the length direction.

12. The photonics die of claim 10, wherein the V-groove has a first end and a second end at the edge of the die substrate, and wherein a spot size converter is at the first end of the V-groove.

13. The photonics die of claim 12, wherein the channel extends between the first end and the second end, and wherein a second channel is provided between the channel and the second end.

14. The photonics die of claim 13, wherein the second channel extends in a length direction that is substantially perpendicular to a length direction of the channel.

15. The photonics die of claim 10, further comprising:
    a plurality of channels into surfaces of the V-groove, wherein the plurality of channels run substantially parallel to each other.

16. The photonics die of claim 15, wherein the plurality of channels are disposed into a first sidewall of the V-groove and a second sidewall of the V-groove.

17. An optical system, comprising:
    a board;
    a package substrate on the board, wherein a channel is in the package substrate;
    a compute die on the package substrate;
    an optics die on the package substrate; and
    an integrated heat spreader (IHS) over the compute die and the optics die, wherein channels are disposed on a surface of the IHS facing the package substrate.

18. The optical system of claim 17, wherein the package substrate comprises a recessed edge, and wherein the channels are disposed over the recess.

19. The optical system of claim 17, wherein the optics die comprises a V-groove, and wherein a second channel is disposed into a surface of the V-groove.

* * * * *